(12) United States Patent
Hsu

(10) Patent No.: US 6,731,502 B1
(45) Date of Patent: May 4, 2004

(54) HEAT DISSIPATION DEVICE FOR SERVER

(75) Inventor: Cheng-Chung Hsu, Taipei (TW)

(73) Assignee: Inventec Corporation (TW)

( * ) Notice: Subject to any disclaimer, the term of this patent is extended or adjusted under 35 U.S.C. 154(b) by 0 days.

(21) Appl. No.: 10/350,761

(22) Filed: Jan. 23, 2003

(30) Foreign Application Priority Data

Nov. 14, 2002 (TW) .................................... 91218272 U

(51) Int. Cl.$^7$ ................................................ H05K 7/20
(52) U.S. Cl. ..................... 361/695; 361/687; 165/80.3; 454/184; 415/213.1
(58) Field of Search ................................ 361/690, 694, 361/695; 174/16.1; 165/80.3, 104.33, 122; 454/184

(56) References Cited

U.S. PATENT DOCUMENTS

| | | | | |
|---|---|---|---|---|
| 6,040,981 A | * | 3/2000 | Schmitt et al. ............. | 361/695 |
| 6,244,953 B1 | * | 6/2001 | Dugan et al. ............... | 454/184 |
| 6,297,444 B1 | * | 10/2001 | Chuang et al. ......... | 174/17 VA |
| 6,343,011 B1 | * | 1/2002 | Yu .............................. | 361/695 |
| 6,438,984 B1 | * | 8/2002 | Novotny et al. ........... | 62/259.2 |
| 6,464,578 B1 | * | 10/2002 | Chin et al. .................. | 454/184 |
| 6,556,437 B1 | * | 4/2003 | Hardin ........................ | 361/687 |
| 6,587,335 B1 | * | 7/2003 | Nelson et al. .............. | 361/687 |

* cited by examiner

*Primary Examiner*—Boris Chervinsky
(74) *Attorney, Agent, or Firm*—Fulbright & Jaworski LLP

(57) ABSTRACT

A heat dissipation device for a server is provided, composed of a fan body and a guide cover for concentrating airflows. The guide cover concentrates heat flows from a server computer and directs the heat flows to the fan body connected with the guide cover. The fan body includes a housing and at least a fan set, wherein the fan set is inserted into a passage formed by the housing, and a fan of the fan set operates to dissipate heat flows directed by the guide cover to outside of the server computer so as to enhance heat dissipation performances. Moreover, the fan set can he easily assembled or disassembled, and optionally replaced or altered in number thereof provided for the fan body, thereby attaining to flexibly in the use of the heat dissipation device.

11 Claims, 5 Drawing Sheets

HEAT DISSIPATION DEVICE FOR SERVER

FIELD OF THE INVENTION

The present invention relates to heat dissipation devices, and more particularly, to a heat dissipation device used in a network server for enhancing heat dissipating performances.

BACKGROUND OF THE INVENTION

In respect of a commonly used computer system, a main electronic component such as central processing unit (CPU) mounted in the computer is provided with increased operating speed and enhanced ability of data processing, such that a significant amount of heat is produced during operation of the electronic component. For example, when the electronic component operates in full load, a surface temperature thereof may reach up to or above 100° C., thereby resulting in an overheating problem. A general solution is to install a heat dissipation device (such as heat dissipation fans) in the computer, whereby heat produced from operation of the electronic component can be dissipation via the heat dissipation device so as to eliminate operational burden applied to the electronic component by overheat that may damage or impair the electronic component or computer system.

With improvement in operating speed of electronic components, current heat dissipation devices fail to provide satisfactory heat dissipating efficiency. Especially for a CPU used in a network server that normally renders longer term or more complicated operation than a personal computer (PC) in terms of usage time, the number of distant end users, data processing and data accessing times, for solving the heat dissipation problem thereof, it thus requires an advance heat dissipation device or additional heat dissipation devices to improve heat dissipating performances. However, such an arrangement may undesirably increase fabrication costs and makes structural assembly or disassembly relatively inconvenient to implement. In another aspect, if an electronic component in the network server is upgraded with increased operating speed but not for the heat dissipation device, such an old heat dissipation device can not effectively dissipate heat produced from the upgraded electronic component that thereby may be impaired or whose lifetime may be shortened by overheat. As such, it is desired to develop a novel heat dissipation device, which can flexibly arrange internal components thereof to facilitate heat dissipating performances, for example to concentrate heat flows in the computer system or to increase the number of heat dissipation fans, such that the heat dissipation problem in response to upgrading of the electronic component may be solved desirably.

Furthermore, internal components such as heat dissipating fans of a current heat dissipation device are directly fixed to the computer without providing spare installation space for the fans; this not only makes component assembly or disassembly inconvenient to implement but also reduces flexibility in uses of the heat dissipation device. For example, if a heat dissipation fan breaks down or an electronic component of the computer is to be renewed, the entire heat dissipation device may need to be replaced, which thereby undesirably leads to increase in costs.

Therefore, the problem to be solved herein is to provide a heat dissipation device by which heat dissipating performances can be enhanced, and heat dissipation components thereof can be easily assembled/disassembled and altered in structural arrangement to thereby reduce fabrication costs in the use of the heat dissipation device.

SUMMARY OF THE INVENTION

A primary objective of the present invention is to provide a heat dissipation device, which can concentrate heat flows to effectively enhance heat dissipating efficiency.

Another objective of the invention is to provide a heat dissipation device, which can optionally change the number of heat dissipation fans or replace the heat dissipation fans to achieve desirable heat dissipating performances.

A further objective of the invention is to provide a heat dissipation device having spare heat dissipation fans to prolong lifetime of the heat dissipation device.

A further objective of the invention is to provide a heat dissipation device in which heat dissipation fans are simple in structure and easy to be assembled/disassembled, making structural assembly or disassembly time-effective to implement.

In accordance of the foregoing and other objectives, the present invention proposes a heat dissipation device for a server, including: a fan body comprising a housing and at least a fan set, wherein the housing encompasses to form a passage; and a guide cover connected to the fan body. A top side of the housing is formed with a plurality of openings by which the fan set can be inserted into the passage of the housing, and two peripheral sides of the housing are formed with a plurality of elastic members and positioning holes for securing the fan set in position. Moreover, the guide cover is made of a material with poor thermal conductivity and formed with an opening at a side thereof connected to a heat source of the server, the opening acting as a primary inlet for directing heat produced from the heat source into the passage of the housing and dissipating the heat to outside of the server by means of the fan set.

The number of openings formed on the top side of the housing can be optionally increased to accommodate additional fan sets that are used to effectively dissipate concentrated heat flows from the guide cover to outside of the server, thereby improving heat dissipating efficiency and enhancing heat dissipating performances. On the contrary, the fan sets can be optionally decreased in number or replaced, making unused fan sets serve as spare fan sets that may be in use when the primary fan sets break down to thereby prolong lifetime of the fan body. Furthermore, the elastic members and positioning holes formed on the housing facilitate assembly and disassembly of the fan sets, thereby providing convenience and flexibility in structural arrangement for a user using the heat dissipation device.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a heat dissipation device for a server proposed in the present invention are described in detail with reference to FIGS. 1 to 5.

Figure 1:
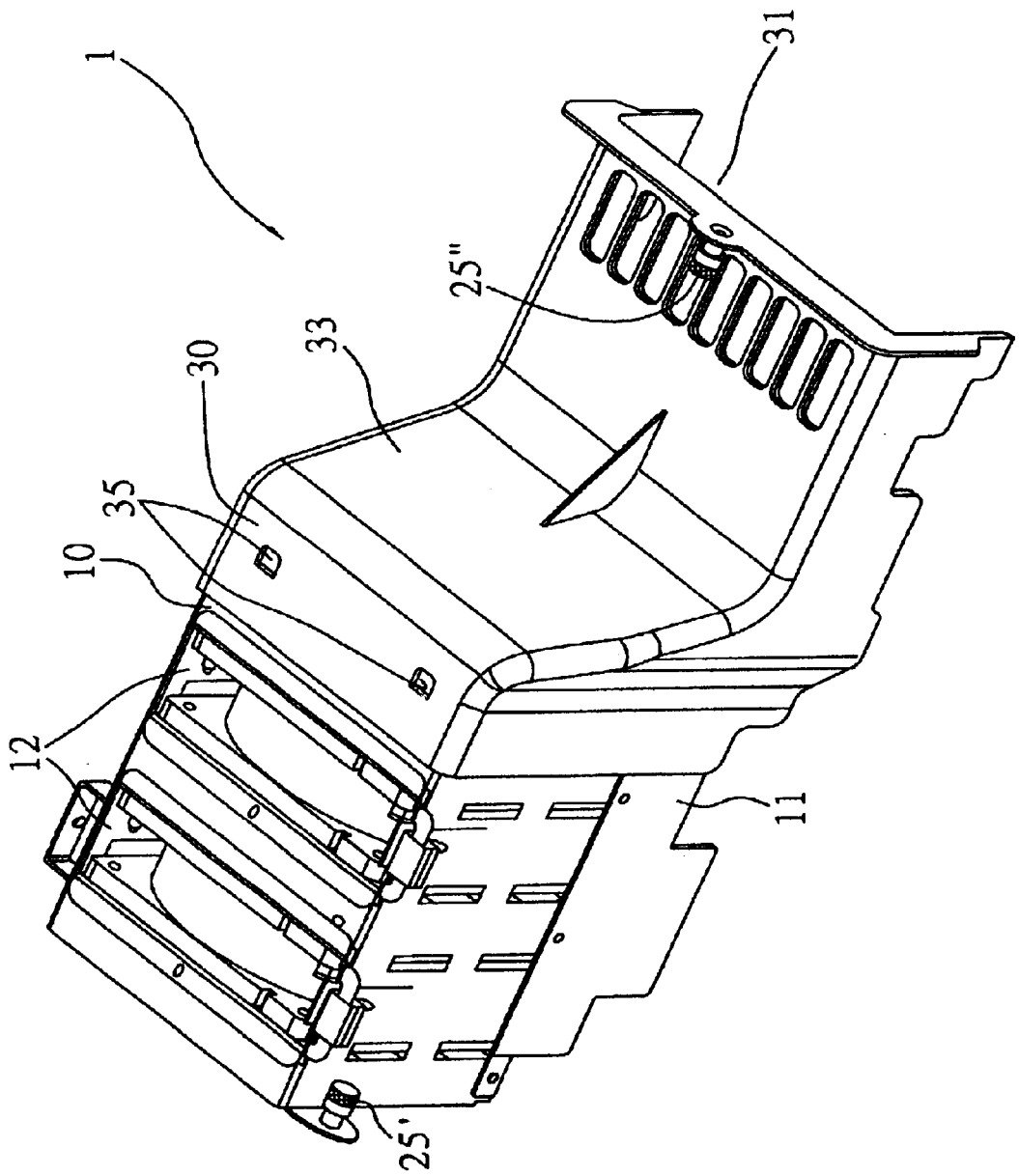
FIG. 1 is a schematic diagram of a heat dissipation device according to a preferred embodiment of the invention.
Figure 2:
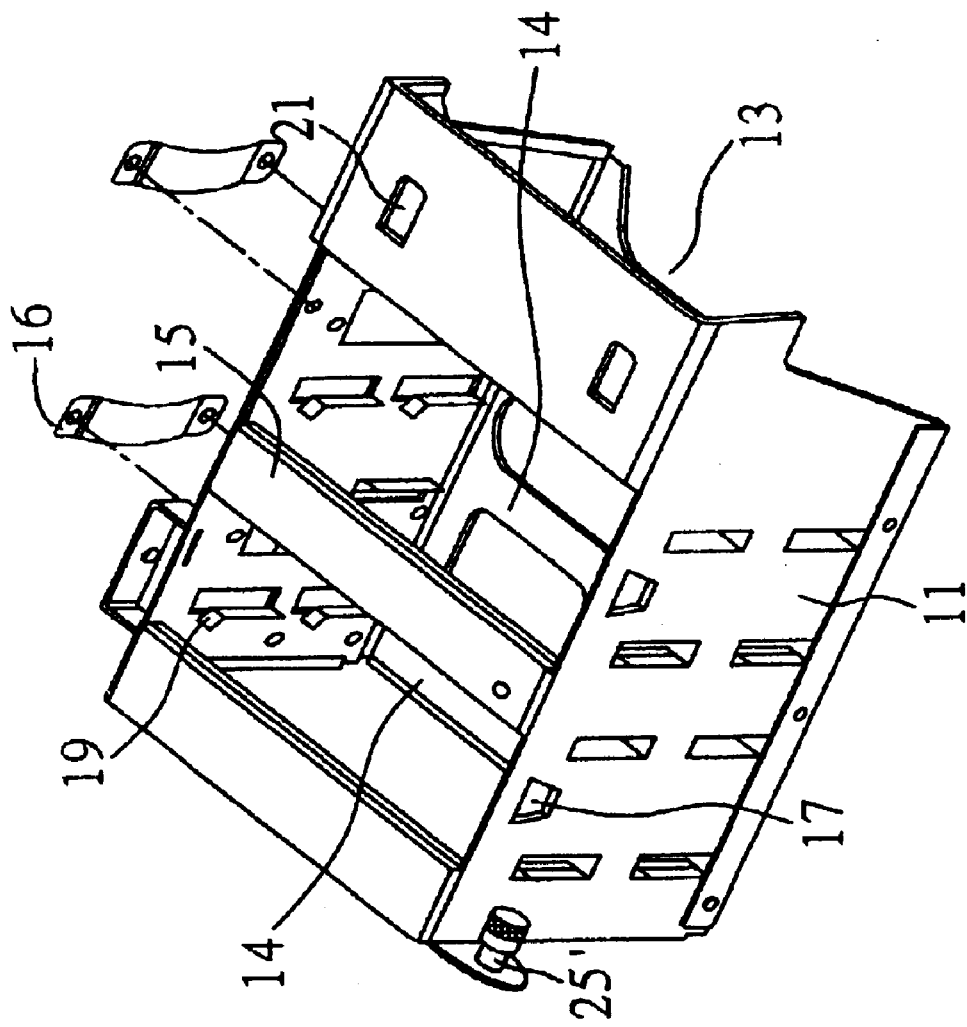
FIG. 2 is a schematic diagram of a housing used in the heat dissipation device shown in FIG. 1.
Figure 3:
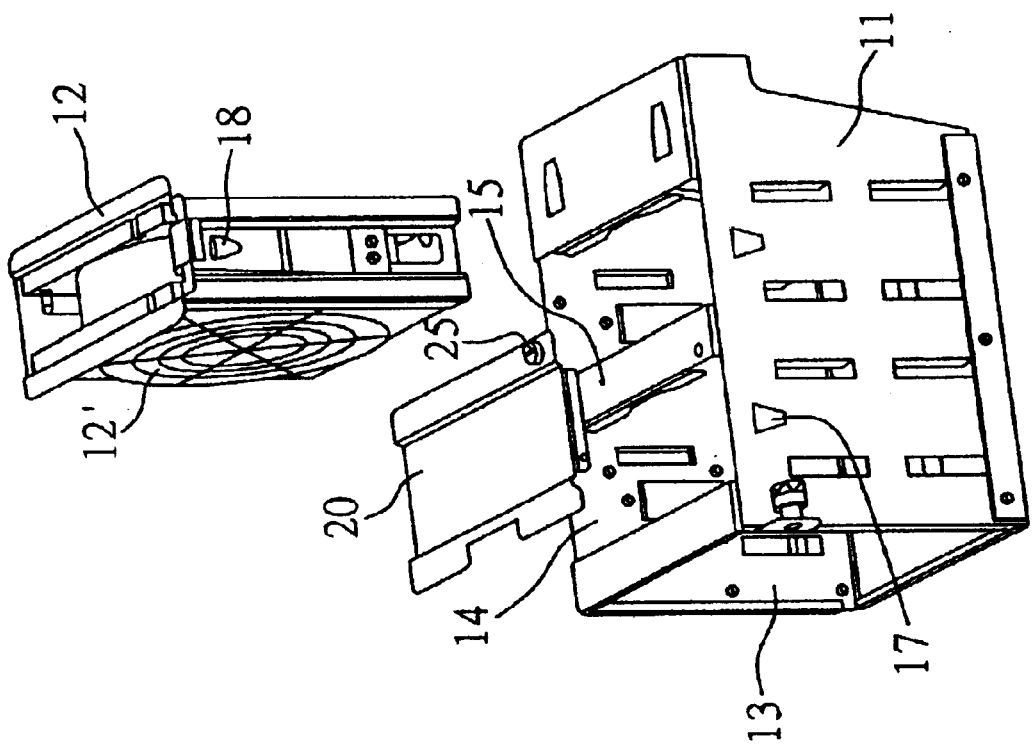
FIG. 3 is a schematic diagram of a fan body of the heat dissipation device shown in FIG. 1.

As shown in FIG. 1, the heat dissipation device 1 according to a preferred embodiment of the invention includes a fan body 10 and a guide cover 30, wherein the fan body 10 is composed of a housing 11 and two fan sets 12 each having a fan 12' (shown in FIG. 3). Sides of the housing 11 encompass to form a passage 13 (shown in FIG. 2), and a top side of the housing is formed with two openings 14 for allowing the two fan sets 12 to be inserted into the passage 13 via the openings 14 respectively. The guide cover 30 is connected to the fan body 10 and formed with inlets 31 (31a, 31b, as shown in FIG. 4) used to concentrate airflows and to direct heat produced from a system heat source into the passage 13 of the fan body 10 by which heat can be dissipated by the fans 12 to outside, wherein an airflow direction in the passage 13 is parallel to an axial direction of the fan sets 12.

The housing 11 is made of a metal material, as shown in FIGS. 2 and 3, sides of the housing 11 encompass to form a passage 13; in other words, the housing 11 is only formed by four sides surrounding the passage 13 without having front and back sides to thereby maximize area for airflows passing through the passage 13. Moreover, a top side of the housing 11 is formed with two openings 14 spaced by an interposer 15, the openings 14 being sized sufficiently for allowing the two fan sets 12 to be inserted via the openings 14 respectively into the passage 13. In order to secure the fan sets 12 in position after being inserted into the openings 14 and to reduce vibration produced by operation of the fans 12', two peripheral sides of the housing 11 are each formed with a pair of elastic pressing members 16 and a pair of positioning holes 17 corresponding in position to the two openings 14 on the top side of the housing 11. When the two fan sets 12 are inserted into the openings 14 respectively, two sides of each of the fan sets 12 are adapted to be engaged with the corresponding elastic pressing members 16 and positioning holes 17, whereby the elastic pressing members 16 are used to secure the fan sets 12 by means of elasticity and reduce vibration of the fans 12' during operation, and the positioning holes 17 are coupled to protrusions 18 (shown in FIG. 3) formed on the two sides of each of the fan sets 12 to enhance positioning of the fan sets 12. Furthermore, on an inner surface of each of the two peripheral sides of the housing 11 there are formed four stopping members 19 for clamping the side of each of the fan sets 12 inserted into the passage 13 so as to facilitate positioning of the fan sets 12 and reduction of vibration during operation of the fans 12'. The above elastic pressing members 16, positioning holes 17 and stopping members 19 formed on the housing 11 further function for simplifying assembly and disassembly of the fan sets 12; in particular, a user can optionally assemble or disassemble the fan sets 12 easily without having to use extra tools. Besides, one or two fan sets 12 are optionally utilized, or when any one of the fan sets 12 breaks down, it can be easily removed without affecting operation of the other fan set 12; as shown in FIG. 3, a lid 20 is attached to and seals an opening 14 by means of a screw 25 if no fan set 12 is provided for the opening 14 formed on the top side of the housing 11.

Figure 4:
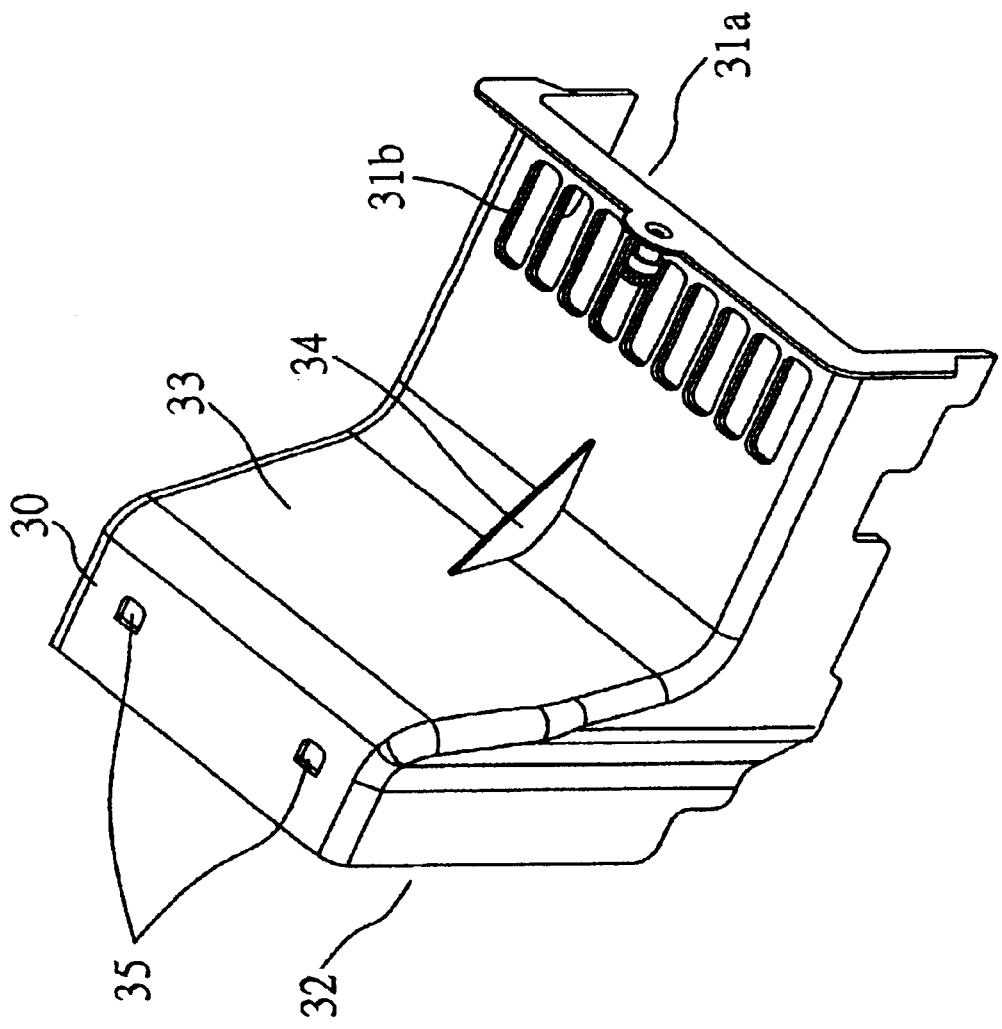
FIG. 4 is a schematic diagram of a guide cover used in the heat dissipation device shown in FIG. 1.

The guide cover 30 is made of a material with poor thermal conductivity; as shown in FIG. 4, the guide cover 30 is shaped in compliance with a structural arrangement of a server system where the heat dissipation device 1 is installed. The guide cover 30 is formed with a step-structured body 33 having differently-sized square openings 31a, 32, wherein the larger opening 32 is connected to the housing 11 of the fan body 10 and acts as a connection opening, and the smaller opening 31a is connected to a system heat source and acts as a primary inlet for the guide cover 30. When heat flows from the system heat source enter into the guide cover 30 via the primary inlet 31a, they pass through the step-structured body 33 and go into the passage 13 of the housing 11 via the connection opening 32 to thereby be dissipated by the fan sets 12 to outside of the server system. Moreover, a top side of the step-structured body 33 is formed with a plurality of auxiliary inlets 31b for increasing heat flows flowing into the guide cover 30 to facilitate improvement in heat dissipation performances the server system. A turning portion of the step-structured body 33 is provided with a triangular member 34 integrally formed with the body 33 and serving as a handle for the guide cover 30.

Figure 5:
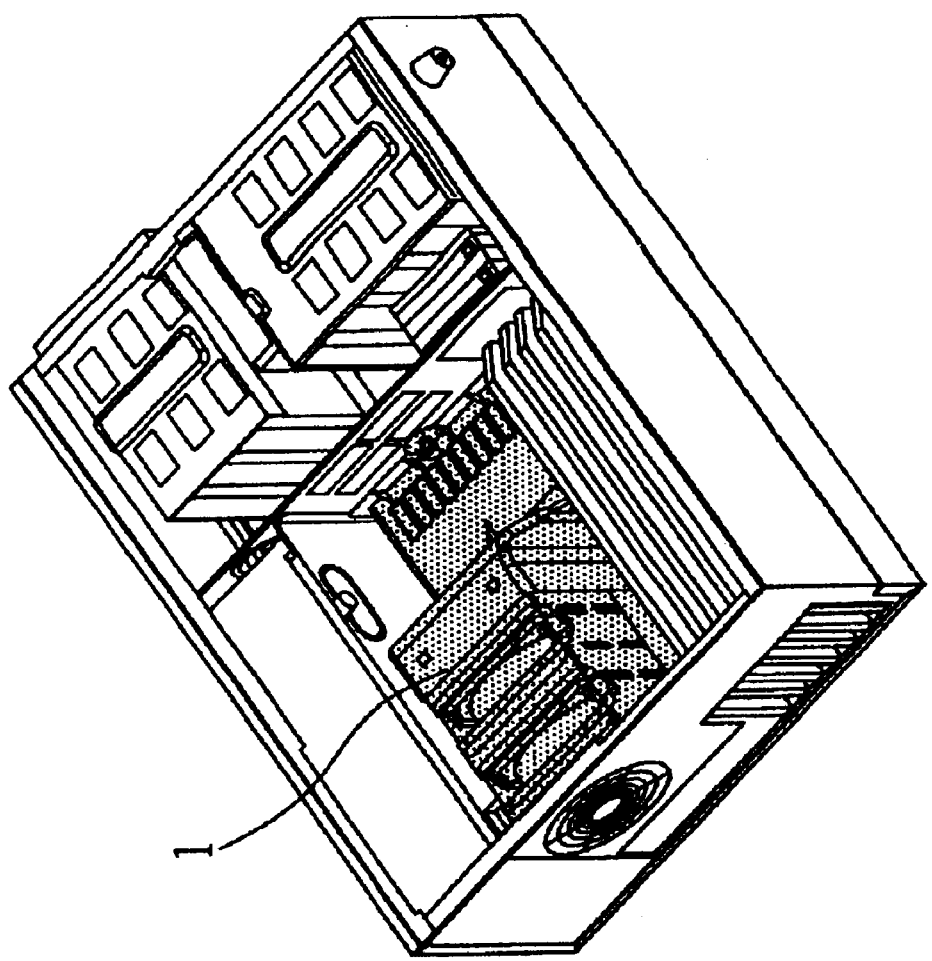
FIG. 5 is a schematic diagram of installation of the heat dissipation device shown in FIG. 1 in a server computer.

As shown in FIG. 1, in the heat dissipation device 1 according to this embodiment, the fan body 10 is engaged with the guide cover 30 in a manner that two hooks 35 integrally formed on the top side of the step-structured body 33 in proximity to the connection opening 32, are coupled to two apertures 21 (shown in FIG. 2) formed on the top side of the housing 11, making the guide cover 30 cover and abut against the top side and two peripheral sides of the housing 11 free of any gap between the guide cover 30 and the housing 11. As a result, heat flows in the guide cover 30 can be entirely and completely directed into the passage 13 of the housing 11 and dissipated to outside by means of the fan sets 12. FIG. 1 further shows screws 25', 25' respectively provided on the fan body 11 and the guide cover 30, which are used to fix the heat dissipation device 1 to the server computer in a manner as shown in FIG. 5.

Therefore, compared to the prior art, the heat dissipation device 1 according to the invention is beneficial with provision of the guide cover 3 for concentrating heat flows, the fan sets 12 that are replaceable and easy to be assembled/disassembled, and spare openings 14 formed on the housing 11 for accommodating additional fan sets 12, such that heat dissipation performances and operational convenience for users both can be enhanced.

Furthermore, the number of fan sets 12 and corresponding openings 14 are not limited to those shown in the drawings, but can be flexibly increased according to different requirements and designs to improve heat dissipating efficiency, or flexibly adjusted in arrangement of the fan sets 12 in the use of the heat dissipation device 1 according to the invention. The guide cover 30 is not limitedly shaped as the foregoing step-like structure but can be flexibly shaped in compliance with a spatial arrangement of the server computer. The location and number of auxiliary inlets 31b on the guide cover 30 can also be optionally altered in accordance with the location of system heat source and an amount of heat being produced.

In addition, besides the server computer, the heat dissipation device 1 according to the invention can also be applied to a desktop computer, notebook computer or domestic appliance that produces heat during operation and needs to dissipate the heat to outside, for the purposes of enhancing heat dissipation performances and facilitating convenience in assembly/disassembly of the heat dissipation device 1.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A heat dissipation device for a server, comprising:
   a fan body comprising a housing and at least a fan set, wherein the housing encompasses to form a first passage and a side wall of the housing is formed with a plurality of openings, the fan set being inserted into the first passage through one of the openings, allowing an airflow direction in the first passage to be parallel to an axial direction of the fan set, and the housing is formed with at least a coupling member for fixing the fan set to the housing; and
   a guide cover having a second passage and connected to the fan body, for concentrating heat flows and directing heat produced from a heat source of the server via the second passage of the guide cover into the first passage of the fan body, so as to allow the heat to be dissipated to outside by the fan set.

2. The heat dissipation device for a server of claim 1, wherein a hook integrally formed on the guide cover is engaged with an aperture formed through the housing for connecting the guide cover to the fan body.

3. The heat dissipation device for a server of claim 1, wherein the coupling member formed on the housing includes at least a set of elastic pressing member and positioning hole for securing the fan set in position.

4. The heat dissipation device for a server of claim 1, wherein the openings of the housing not inserted with the fan set are covered by a lid.

5. The heat dissipation device for a server of claim 1, wherein the guide cover is formed with an opening at a side thereof connected to the heat source, the opening of the guide cover acting as a primary inlet for concentrating the heat flows.

6. The heat dissipation device for a server of claim 5, wherein at least an auxiliary inlet is formed on a side of the guide cover other than the side formed with the primary inlet, so as to increase the heat flows directed into the guide cover by means of the auxiliary inlet.

7. The heat dissipation device for a server of claim 1, wherein the heat source is an electronic component of the server.

8. The heat dissipation device for a server of claim 7, wherein the electronic component is a central processing unit (CPU).

9. The heat dissipation device for a server of claim 1, wherein the housing of the fan body is made of a metal material.

10. The heat dissipation device for a server of claim 1, wherein the guide cover is made of a material with poor thermal conductivity.

11. The heat dissipation device for a server of claim 1, wherein the heat dissipation device is applicable to a desktop computer, notebook computer, or domestic appliance.

* * * * *